(12) United States Patent
Chang

(10) Patent No.: US 7,539,017 B2
(45) Date of Patent: May 26, 2009

(54) HEAT DISSIPATING DEVICE FOR CENTRAL PROCESSOR

(76) Inventor: Kuo Ta Chang, P.O. Box 10-69, Chong Ho, Taipei (TW) 235

( * ) Notice: Subject to any disclaimer, the term of this patent is extended or adjusted under 35 U.S.C. 154(b) by 1554 days.

(21) Appl. No.: 10/401,488

(22) Filed: Mar. 27, 2003

(65) Prior Publication Data
US 2004/0190257 A1  Sep. 30, 2004

(51) Int. Cl.
*H05K 7/20* (2006.01)
(52) U.S. Cl. .................. 361/703; 361/709; 361/710
(58) Field of Classification Search .......... 361/703, 361/709, 710
See application file for complete search history.

(56) References Cited

U.S. PATENT DOCUMENTS

| | | | | |
|---|---|---|---|---|
| 4,682,651 A | * | 7/1987 | Gabuzda ............... | 165/80.3 |
| 4,823,869 A | * | 4/1989 | Arnold et al. ........... | 165/185 |
| 4,899,210 A | * | 2/1990 | Lorenzetti et al. ........ | 257/712 |
| 5,208,731 A | * | 5/1993 | Blomquist ............... | 361/704 |
| 5,369,301 A | * | 11/1994 | Hayashi et al. .......... | 257/722 |
| D356,777 S | * | 3/1995 | Katsui et al. ........... | D13/179 |
| 5,455,382 A | * | 10/1995 | Kojima et al. .......... | 174/16.3 |
| 5,495,392 A | | 2/1996 | Shen | |
| 5,519,575 A | * | 5/1996 | Chiou ................... | 361/697 |
| 5,584,339 A | | 12/1996 | Hong | |
| 5,597,034 A | * | 1/1997 | Barker et al. ............ | 165/80.3 |
| D398,295 S | * | 9/1998 | Chang .................... | D13/179 |
| 6,034,870 A | | 3/2000 | Osborn | |
| D437,844 S | * | 2/2001 | Sayers et al. ........... | D14/240 |
| 6,222,731 B1 | * | 4/2001 | Katsui .................... | 361/697 |
| 6,310,771 B1 | * | 10/2001 | Chien ..................... | 361/697 |
| 6,382,306 B1 | * | 5/2002 | Hsu ....................... | 165/80.3 |
| 6,434,002 B1 | * | 8/2002 | Wei ........................ | 361/697 |
| 6,460,608 B1 | * | 10/2002 | Katsui .................... | 165/80.3 |
| 6,498,395 B2 | * | 12/2002 | Baek et al. ............... | 257/722 |
| 6,525,939 B2 | * | 2/2003 | Liang et al. ............. | 361/697 |
| 6,691,768 B2 | * | 2/2004 | Hsieh et al. ............. | 165/80.3 |
| 6,817,405 B2 | * | 11/2004 | Kamath et al. .......... | 165/80.3 |
| 6,942,025 B2 | * | 9/2005 | Nair et al. ............... | 165/185 |
| 6,950,306 B2 | * | 9/2005 | Huang et al. ............ | 361/697 |
| 2001/0010624 A1 | * | 8/2001 | Katsui .................... | 361/709 |
| 2002/0131236 A1 | * | 9/2002 | Lin ........................ | 361/709 |
| 2003/0007867 A1 | * | 1/2003 | Chang .................... | 415/220 |
| 2005/0002163 A1 | * | 1/2005 | Lopatinsky et al. ....... | 361/697 |

\* cited by examiner

*Primary Examiner*—Anatoly Vortman

(57) ABSTRACT

A heat dissipating device includes an electric member, a heat sink having a base to be secured on the electric member. The base includes an upper surface and includes four corner areas, and includes four posts extended upwardly from the four corner areas thereof respectively. A fan device is disposed on and secured to the posts. The heat sink includes a number of rods extended upwardly from the upper surface of the base, and each of the rods includes an upper portion, and a recess formed in the upper portions of the rods. Each of the rods preferably includes a planar surface formed on the upper portion to form the recess on top of the rods.

2 Claims, 4 Drawing Sheets

HEAT DISSIPATING DEVICE FOR CENTRAL PROCESSOR

BACKGROUND OF THE INVENTION

1. Field of the Invention

The present invention relates to a heat dissipating device, and more particularly to a heat dissipating device having an increased air circulation or heat dissipating effect.

2. Description of the Prior Art

Various kinds of typical heat dissipating devices have been developed for attaching onto the electric members or elements that may generate heat. For example, the central processor units (CPU) or the other computer members may generate great heat while in use, and are required to be cooled by fan devices.

For example, U.S. Pat. No. 5,495,392 to Shen discloses one of the typical heat dissipating devices for attaching onto CPU, and comprises a number of guide ribs and radiating fins for increasing the contact area with the circulated air. However, the air generated by the fan devices may not flow through the guide ribs and radiating fins, such that the heat dissipating effect thereof is decreased.

U.S. Pat. No. 5,584,339 to Hong discloses another typical heat dissipating device for attaching onto central processors of computers, and comprises a number of heat conductive posts for increasing the contact area with the circulated air. However, the heat conductive posts comprise an identical height that may also decrease the heat dissipating effect thereof.

U.S. Pat. No. 6,034,870 to Osborn et al. discloses a further typical heat dissipating device or heat sink for attaching onto central processors of computers, and comprises a number of heat conductive posts for increasing the contact area with the circulated air, and a fan device attached to the computer, instead of being attached to the heat sink. However, the heat conductive posts also comprise an identical height that may also decrease the heat dissipating effect thereof.

The present invention has arisen to mitigate and/or obviate the afore-described disadvantages of the conventional heat dissipating devices.

SUMMARY OF THE INVENTION

The primary objective of the present invention is to provide a heat dissipating device including an increased air circulation or heat dissipating effect.

In accordance with one aspect of the invention, there is provided a heat dissipating device comprising an electric member, a heat sink disposed on the electric member, and including a base having an upper surface and having four corner areas, and including four posts extended upwardly from the four corner areas thereof respectively, a fan device disposed on the posts. The heat sink including a plurality of rods extended upwardly from the upper surface of the base, the rods each including an upper portion, and the rods including a recess formed in the upper portions thereof.

Each of the rods preferably includes a planar surface formed on the upper portion thereof, and the planar surfaces of the rods may be used to form or to define the recess of the heat sink.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
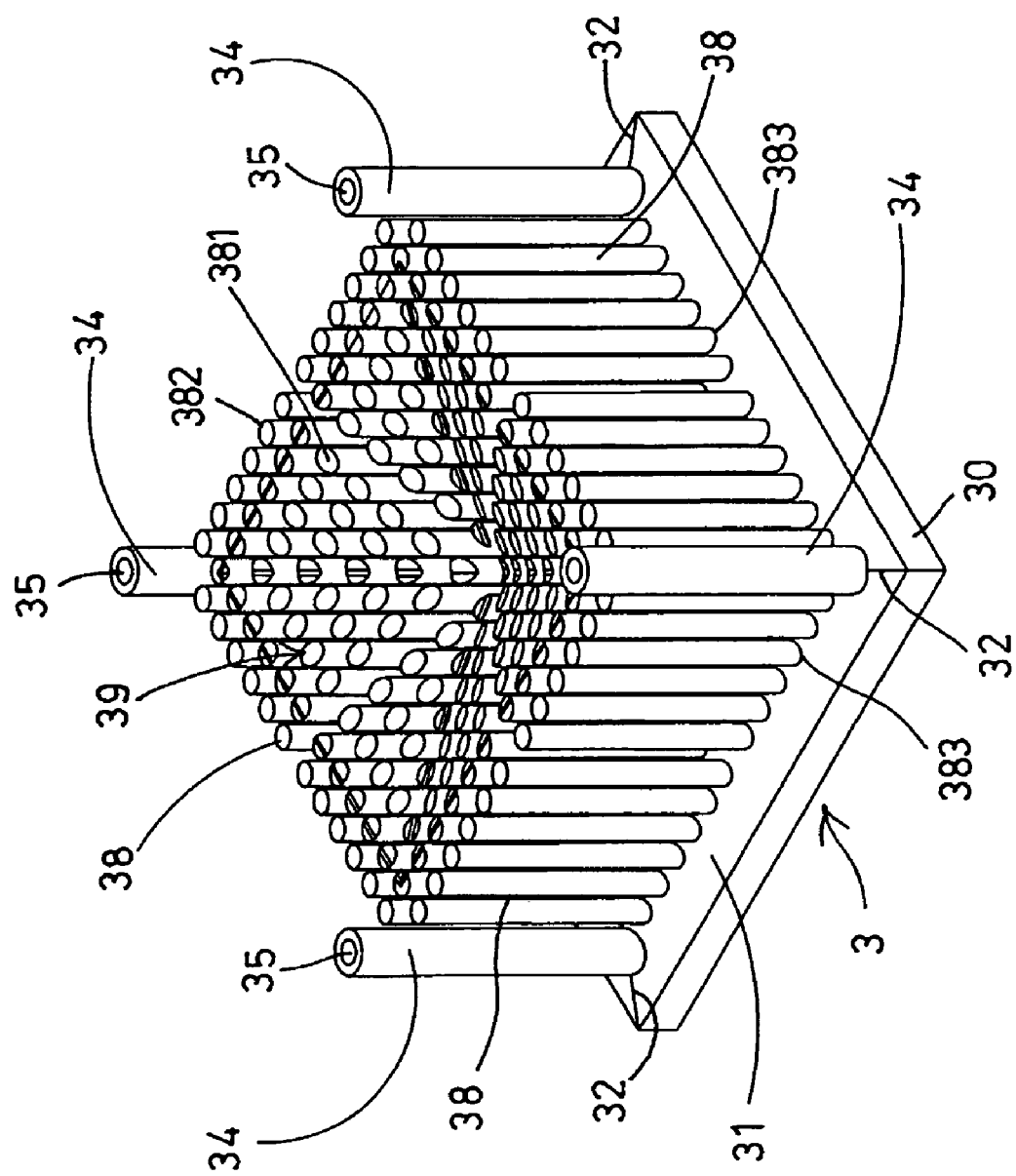
FIG. 1 is an enlarged partial perspective view of a heat sink of a heat dissipating device in accordance with the present invention.

Referring to the drawings, and initially to FIGS. 1-5, a heat dissipating device in accordance with the present invention is provided for attaching onto an electric member, such as a central processor unit (CPU) of the computer facility that may generate great heat while in use, and that is required to be cooled by fan devices. The heat dissipating device comprises a heat sink 3 to be secured onto the electric member with fasteners, latches or the like.

Figure 2:
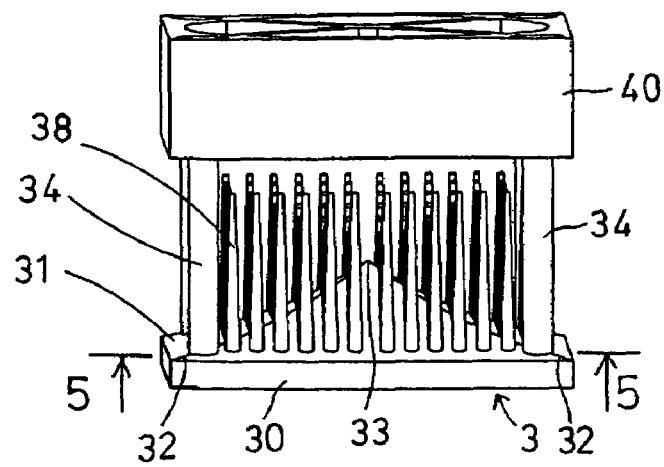
FIG. 2 is a perspective view of the heat dissipating device.
Figure 3:
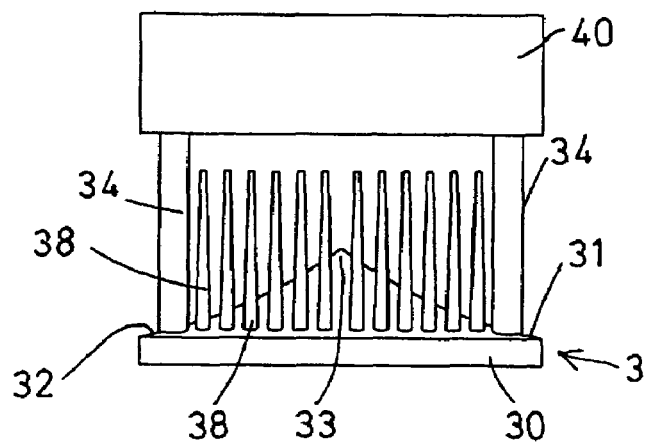
FIG. 3 is a front view of the heat dissipating device.
Figure 4:
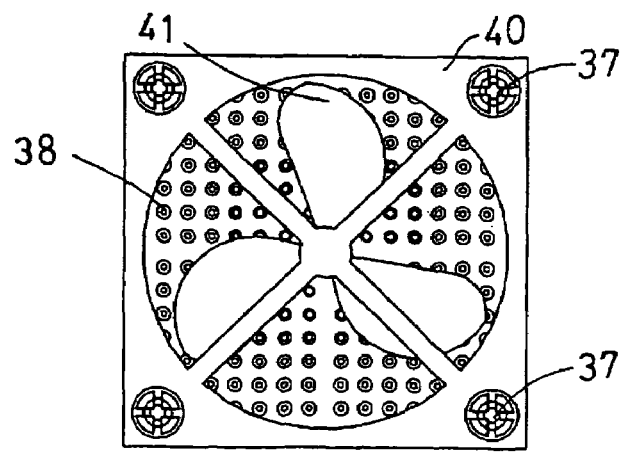
FIG. 4 is a top view of the heat dissipating device.
Figure 5:
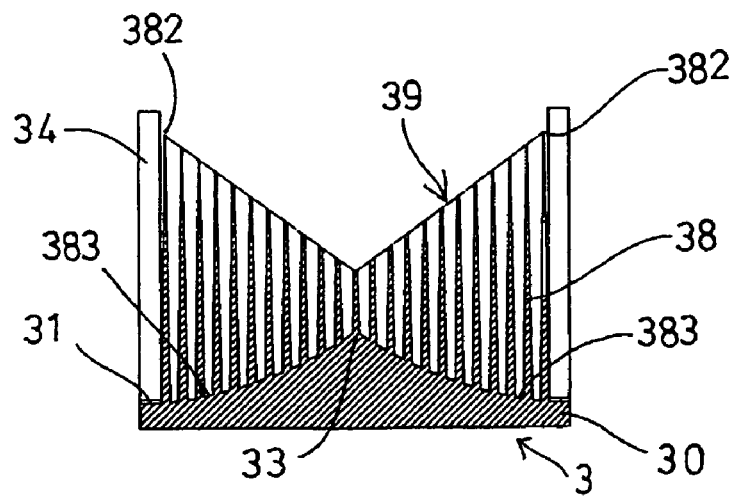
FIG. 5 is a cross sectional view taken along lines 5-5 of FIG. 2.

The heat sink 3 includes a base 30 having an upper surface 31, tapered or tilted or inclined from four corner areas 32 thereof toward the central or middle portion thereof, in order to form a cusp 33 on the central or middle portion thereof (FIGS. 2, 3, 5). The heat sink 3 includes four posts 34 extended from the four corner areas 32 thereof respectively, and each having a hole 35 formed therein for receiving or threading with fasteners 37 respectively (FIG. 4).

Figure 6:
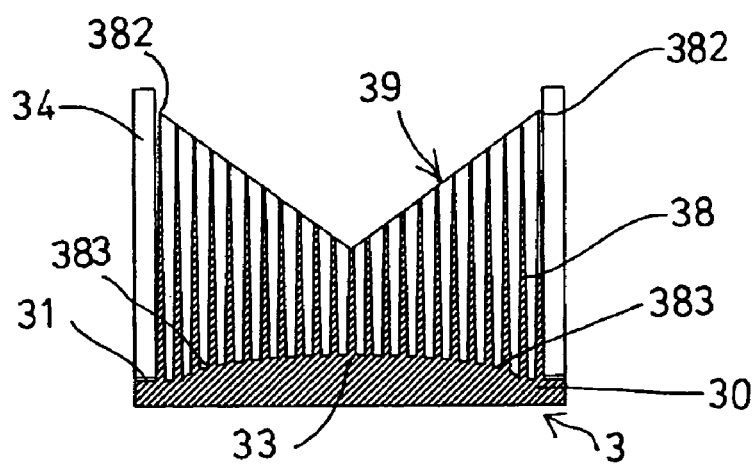
FIGS. 6, 7 are cross sectional views similar to FIG. 5, illustrating the other arrangement of the heat dissipating device.

As shown in FIG. 6, the cusp 33 on the central or middle portion of the base 30 or the upper surface 31 of the heat sink 3 may include a sharp or steep cusp as shown in FIGS. 2, 3, 5, or a convex or curved and smooth cusp as shown in FIG. 6. Alternatively, the upper surface 31 of the base 30 of the heat sink 3 may include a concave or curved or smooth recess as shown in FIG. 7.

A fan device 40 is disposed on top of the posts 34, and secured to the posts 34 of the base 30 with the fasteners 37, and includes one or more fan blades or a fan member 41 disposed in the middle or central portion thereof, and thus supported above the central or middle portion of the upper surface 31 of the base 30.

The base 30 further includes a number of fins or rods 38 extended upwardly from the upper surface 31 thereof, and arranged within or between the posts 34. The rods 38 may include a planar or curved upper surface 381 formed or provided on the upper portion 382 thereof, as shown in FIG. 1, or may include a sharp tip provided on the upper portion 382 thereof. The rods 38 each may include a lower portion 383 having a greater outer diameter than that of the upper portion 382 thereof, in order to further increase the outer surface area of the rods 38. Each rod 38 is dependent from the cusp 33 and is embedded into the cusp 33.

Figure 7:
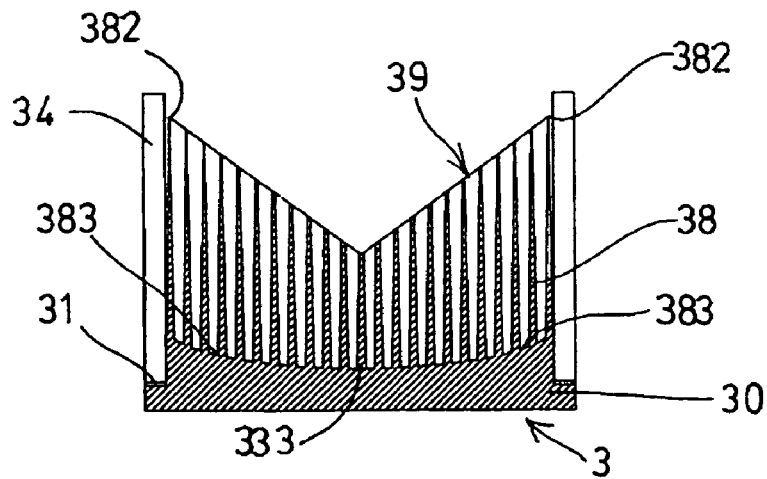

As best shown in FIGS. 5-7, the rods 38 that are located closer to the four corner areas 32 of the base 30 include a greater height, and the rods 38 that are located closer to the central or middle cusp 33 of the base 30 include a smaller height, such that a concave recess 39 may be formed in or defined by the upper portions of the rods 38.

Figure 8:
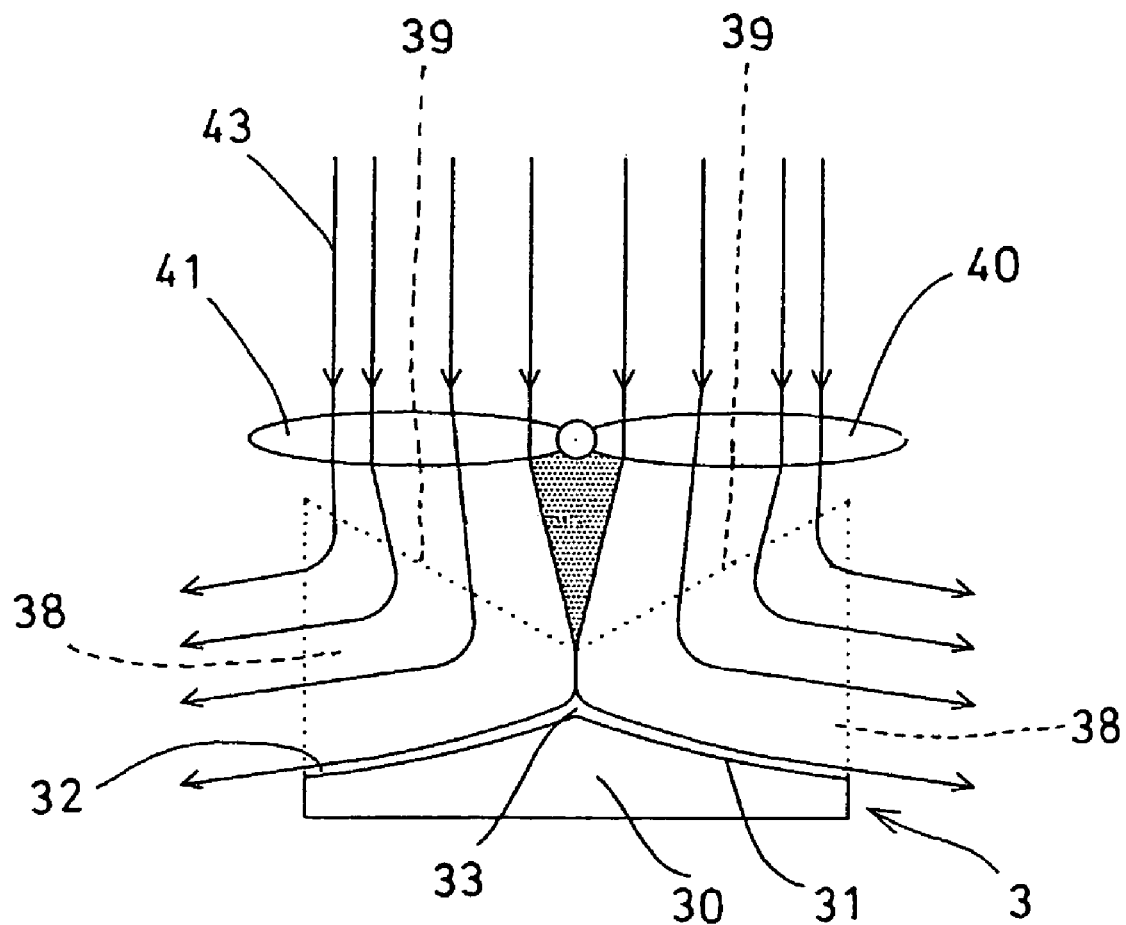
FIG. 8 is a plan schematic view illustrating the air circulation generated by the fan device of the heat dissipating device.

In operation, as shown in FIG. 8, when the fan device 40 is energized, the fan device 40 may circulate or force the air 43 to flow downwardly toward the concave recess 39 that is defined by the upper portions of the rods 38, and then the air 43 may be guided to flow from the central or middle portion of the heat sink 3 toward the outer peripheral portion of the heat sink 31 by the inclined or tapered upper surface 31 of the base 30.

The air 43 may have a greater contact area with the rods 38 that have increased outer peripheral surfaces or areas, and may be guided to flow from the central or middle portion of the heat sink 3 toward the outer peripheral portion of the heat sink 31 by the inclined or tapered upper surface 31 of the base 30. In addition, the rods 38 may include a concave recess 39 formed in the upper portions 382 thereof, for increasing the air circulation through the rods 38 of the heat sink 3.

Accordingly, the heat dissipating device in accordance with the present invention includes an increased air circulation or heat dissipating effect.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A heat dissipating device comprising:
a heat sink (3) including a base (30) having an upper surface (31) which is tapered and inclined from four corner areas (32) thereof toward a middle portion thereof with the middle portion being higher than edges thereof, the heat sink (3) includes four posts (34) extended from the four corner areas (32) thereof respectively, and each having a hole (35) formed therein for receiving or threading with fasteners (37) respectively;
a cusp (33) on a middle portion of the base (30) and the upper surface (31) of the heat sink (3);
a fan device disposed on tops of the posts (34), and secured to the posts (34) of the base (30) with the fasteners (37), and including one or more fan blades or a fan member (41) disposed in the middle portion thereof, and thus supported above the middle portion of the upper surface (31) of the base (30);
a number of rods (38) extended upwardly from the upper surface (31) of the base (30), and arranged between the posts (34); the rods (38) including a curved upper surface (381) formed on an upper portion (382) thereof; the rods (38) each including a lower portion (383) having a greater outer diameter than that of the upper portion (382) thereof, in order to further increase the outer surface area of the rods (38); each rod (38) being dependent from the cusp (33) and being embedded into the cusp (33); and
the rods (38) that are located closer to the four corner areas (32) of the base (30) include a greater height, and the rods (38) that are located closer to the middle cusp (33) of the base (30) including a smaller height, such that a concave recess (39) is formed in by the upper portions of the rods (38).

2. The heat dissipating device as claimed in claim 1, wherein an upper surface (31) of the base (30) of the heat sink (3) includes a concave smooth recess.

\* \* \* \* \*